(12) United States Patent
Bathan et al.

(10) Patent No.: US 8,193,037 B1
(45) Date of Patent: Jun. 5, 2012

(54) INTEGRATED CIRCUIT PACKAGING SYSTEM WITH PAD CONNECTION AND METHOD OF MANUFACTURE THEREOF

(75) Inventors: Henry Descalzo Bathan, Singapore (SG); Zigmund Ramirez Camacho, Singapore (SG); Dioscoro A. Merilo, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 10 days.

(21) Appl. No.: 12/961,490

(22) Filed: Dec. 6, 2010

(51) Int. Cl.
*H01L 21/50* (2006.01)
*H01L 21/48* (2006.01)
*H01L 21/44* (2006.01)

(52) U.S. Cl. ........ 438/111; 438/106; 438/112; 438/119; 438/123; 438/124; 257/E21.504; 257/E21.506; 257/E21.509

(58) Field of Classification Search ........... 257/E21.504, 257/E21.506, E21.509
See application file for complete search history.

(56) References Cited

U.S. PATENT DOCUMENTS

| | | | |
|---|---|---|---|
| 5,656,550 A | 8/1997 | Tsuji et al. | |
| 7,049,177 B1 | 5/2006 | Fan et al. | |
| 7,129,116 B2 | 10/2006 | Islam et al. | |
| 7,312,105 B2 | 12/2007 | Huang et al. | |
| 7,838,975 B2 | 11/2010 | Chen | |
| 7,888,181 B2 * | 2/2011 | Camacho et al. | 438/118 |
| 8,067,825 B2 * | 11/2011 | Advincula et al. | 257/676 |
| 8,105,915 B2 * | 1/2012 | Camacho et al. | 438/455 |

OTHER PUBLICATIONS

U.S. Appl. No. 12/961,489, filed Dec. 6, 2010, Camacho et al.

* cited by examiner

*Primary Examiner* — Mohsen Ahmadi
(74) *Attorney, Agent, or Firm* — Ishimaru & Associates LLP; Mikio Ishimaru; Stanley Chang (57) ABSTRACT

A method of manufacture of an integrated circuit packaging system includes: forming a lead having a horizontal ridge at a lead top side; forming a connection layer having an inner pad and an outer pad directly on the lead top side, the inner pad having an inner pad bottom surface; mounting an integrated circuit over the inner pad; applying a molding compound, having a molding bottom surface, over the integrated circuit, the inner pad, and the outer pad; and applying a dielectric directly on the molding bottom surface and the inner pad bottom surface.

11 Claims, 5 Drawing Sheets

INTEGRATED CIRCUIT PACKAGING SYSTEM WITH PAD CONNECTION AND METHOD OF MANUFACTURE THEREOF

TECHNICAL FIELD

The present invention relates generally to an integrated circuit packaging system, and more particularly to a system for an integrated circuit packaging system with connection.

BACKGROUND ART

Modem electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having a horizontal ridge at a lead top side; forming a connection layer having an inner pad and an outer pad directly on the lead top side, the inner pad having an inner pad bottom surface; mounting an integrated circuit over the inner pad; applying a molding compound, having a molding bottom surface, over the integrated circuit, the inner pad, and the outer pad; and applying a dielectric directly on the molding bottom surface and the inner pad bottom surface.

The present invention provides an integrated circuit packaging system, including: a lead having a horizontal ridge at a lead top side; a connection layer having an inner pad and an outer pad directly on the lead top side, the inner pad having an inner pad bottom surface; an integrated circuit over the inner pad; a molding compound, having a molding bottom surface, over the integrated circuit, the inner pad, and the outer pad; and a dielectric directly on the molding bottom surface and the inner pad bottom surface.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
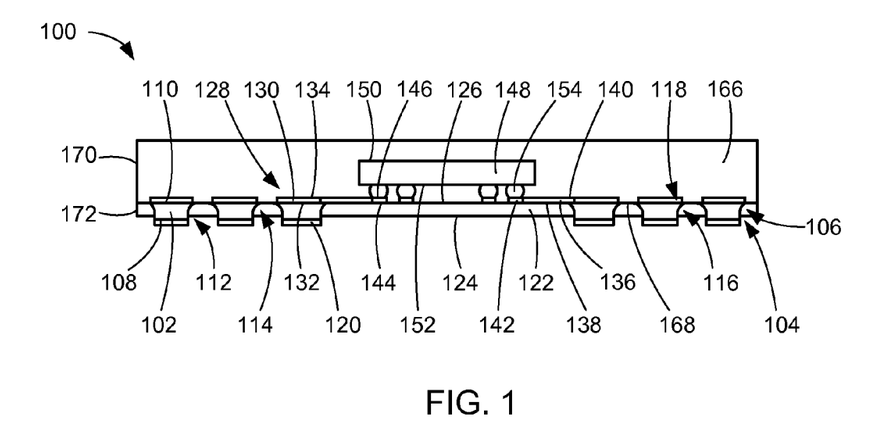
FIG. 1 is a cross-sectional view of an integrated circuit packaging system taken along line 1-1 of FIG. 2 in a first embodiment of the present invention.
Figure 2:
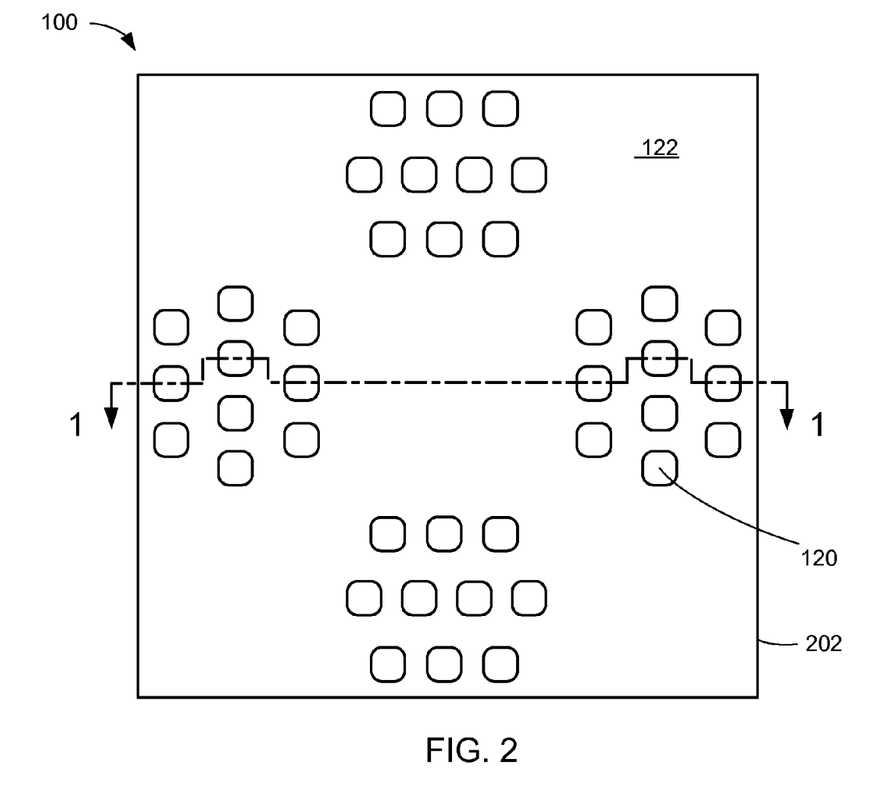
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a multi-row quad flat nonleaded (QFN) package with a routed trace and a bottom mask for a flip chip. The integrated circuit packaging system 100 can include a quad flat nonleaded sawn strip etch (QFNs-se) package without standoff.

The integrated circuit packaging system 100 can include a lead 102, which provides electrical connectivity between the integrated circuit packaging system 100 and an external system (not shown). The lead 102 can include a lead bottom portion 104 and a lead top portion 106 opposite or over the lead bottom portion 104.

The lead 102 can include a lead bottom side 108 and a lead top side 110 opposite the lead bottom side 108. The lead bottom side 108 is a bottom extent of the lead bottom portion 104. The lead top side 110 is a top extent of the lead top portion 106.

The lead 102 can include a lead non-horizontal side 112 between the lead bottom side 108 and the lead top side 110. A plane of the lead non-horizontal side 112 can intersect planes of the lead bottom side 108 and the lead top side 110.

The lead 102 can include a horizontal ridge 114, which is an end of the lead 102, horizontally protruding from the lead non-horizontal side 112. The horizontal ridge 114 can be formed at the lead top side 110.

The horizontal ridge 114 can include a ridge lower side 116 and a ridge upper side 118 above the ridge lower side 116. The ridge lower side 116 can include a curve surface. The ridge upper side 118 can include a flat surface.

The integrated circuit packaging system 100 can include a conductive layer 120, which provides an electrical connection between the lead 102 and an external system. The conductive layer 120 can be electrically connected or attached to the lead 102. The conductive layer 120 can be formed directly on the lead bottom side 108.

The integrated circuit packaging system 100 can include a dielectric 122, which protects a portion of the lead 102. The dielectric 122 can include an insulation material including a passivation, a solder resist, an epoxy, or an underfill-type adhesive.

The dielectric 122 can electrically isolate the lead 102 from another of the lead 102. The dielectric 122 can be formed surrounding the horizontal ridge 114. The dielectric 122 can be formed directly on the ridge lower side 116. The dielectric 122 can be formed surrounding the lead top portion 106 of the lead 102.

The dielectric 122 can include a dielectric bottom side 124 and a dielectric top side 126 opposite the dielectric bottom side 124. The dielectric bottom side 124 can be above the conductive layer 120.

The lead top portion 106 can include the lead top side 110. A plane of the lead top side 110 or a plane of the ridge upper side 118 can be coplanar with a plane of the dielectric top side 126.

The lead bottom portion 104 of the lead 102 can be exposed from the dielectric 122. The lead bottom portion 104 can protrude from the dielectric bottom side 124. The lead bottom portion 104 can include the lead bottom side 108 below the dielectric bottom side 124. The conductive layer 120 can be below the dielectric bottom side 124.

The integrated circuit packaging system 100 can include a connection layer 128, which is a structure that provides electrical connectivity between a semiconductor device and the lead 102. For example, the connection layer 128 can include a redistribution layer (RDL) on a multi-row copper leadframe.

The connection layer 128 can include an outer pad 130, which provides electrical connectivity to the lead 102. The outer pad 130 can include an outer pad bottom surface 132 directly on the lead top side 110. The outer pad 130 can include an outer pad top surface 134 opposite the outer pad bottom surface 132.

The connection layer 128 can include a conductive trace 136. The conductive trace 136 provides or routes electrical connection between the outer pad 130 and a contact pad. For example, the conductive trace 136 can include an electrical connector including a redistribution trace, a routed layer, a routed pre plated frame (PPF) layer, or a redistribution layer (RDL).

The conductive trace 136 can include a trace bottom surface 138 directly on the dielectric top side 126 and a portion of the lead top side 110. The trace bottom surface 138 can be directly on a portion of the ridge upper side 118. The conductive trace 136 can include a trace top surface 140 opposite the trace bottom surface 138.

The connection layer 128 can include an inner pad 142. The inner pad 142 is a contact pad that provides mounting support and electrical connectivity to a semiconductor device. The inner pad 142 can be connected or attached to the conductive trace 136.

The inner pad 142 can include an inner pad bottom surface 144 directly on the dielectric top side 126. The inner pad 142 can include an inner pad top surface 146 opposite the inner pad bottom surface 144.

The connection layer 128 can include planes of the outer pad bottom surface 132, the trace bottom surface 138, and the inner pad bottom surface 144 coplanar with each other. The connection layer 128 can include planes of the outer pad top surface 134, the trace top surface 140, and the inner pad top surface 146 coplanar with each other.

The integrated circuit packaging system 100 can include an integrated circuit 148, which is a semiconductor device. The integrated circuit 148 can include an inactive side 150 and an active side 152 opposite the inactive side 150. For example, the integrated circuit 148 can include a semiconductor device including a flip chip or a silicon (Si) die.

The integrated circuit 148 can include the active side 152 facing the connection layer 128. The integrated circuit 148 can be mounted over the inner pad 142 of the connection layer 128.

The integrated circuit packaging system 100 can include an internal connector 154, which is an electrically conductive connector. The internal connector 154 can be connected or attached to the inner pad 142 and the active side 152. The internal connector 154 can be directly on the inner pad top surface 146.

The integrated circuit packaging system 100 can include the dielectric 122 electrically isolating the connection layer 128 from another of the connection layer 128. The integrated circuit packaging system 100 can include a number of the outer pad 130 surrounding or outside a perimeter of the integrated circuit 148. The integrated circuit packaging system 100 can include a number of the inner pad 142 under the inactive side 150 of the integrated circuit 148.

The integrated circuit packaging system 100 can include a molding compound 166, which covers a semiconductor package to seal a semiconductor device providing mechanical and environmental protection. The molding compound 166 can be formed covering the dielectric 122, the connection layer 128, the integrated circuit 148, and the internal connector 154. The molding compound 166 can be applied over the dielectric top side 126, the outer pad 130, the conductive trace 136, the inner pad 142, the integrated circuit 148, and the internal connector 154.

The molding compound 166 can include a molding bottom surface 168. A plane of the molding bottom surface 168 can be coplanar with planes of the outer pad bottom surface 132, the trace bottom surface 138, and the inner pad bottom surface 144. The molding bottom surface 168 and the inner pad bottom surface 144 can be directly on the dielectric top side 126.

The molding compound 166 can include a molding non-horizontal side 170, which is a horizontal extent of the molding compound 166. A plane of the molding non-horizontal side 170 can be coplanar with a plane of a dielectric non-horizontal side 172 of the dielectric 122. The dielectric non-horizontal side 172 is a horizontal extent of the dielectric 122.

It has been discovered that the connection layer 128 connected to the lead 102 and the integrated circuit 148 provides a simple and cost-effective process for multi-row quad flat nonleaded (QFN) packages having flip chips with copper base strip etch process technology thereby fulfilling a need to efficiently configure a multi-row quad flat nonleaded (QFN) package for a flip chip device.

It has also been discovered that the connection layer 128 having the conductive trace 136 attached to the outer pad 130 and the inner pad 142 provides a solution that does not use bismaleimide triazine (BT) laminate for flip chip applications to redistribute flip chip signals to quad flat nonleaded (QFN) multi-row leads.

It has further been discovered that the connection layer 128 provides cost reductions due to simpler leadframe construction compared to standard flip chip ball grid array (BGA).

It has been unexpectedly found that the lead 102 having the horizontal ridge 114 covered by the dielectric 122 improves lead interlocking thereby eliminating lead pullouts.

It has been unexpectedly determined that the outer pad 130 attached to the lead top side 110 provides a reliable connection site to attach or connect the lead 102 to a stack device.

It has been unexpectedly recognized that the connection layer 128 protected by the dielectric 122 is better for flip chip mounting thereby eliminating solder collapse, solder creep, or misalignment.

It has been unexpectedly ascertained that the dielectric 122 improves reliability by isolating the connection layer 128 from another of the connection layer 128 or the lead 102 from another of the lead 102 thereby eliminating solder creep or electrical shorts.

It has been unexpectedly identified that the conductive layer 120 provides a reliable electrical connection between the lead 102 and an external system.

It has been unexpectedly observed that the connection layer 128 directly on the lead 102 and the dielectric 122 provides a simple process flow and package structure for flip chip packaging.

It has been unexpectedly uncovered that the outer pad 130 and the inner pad 142 having reduced pad pitch and the conductive trace 136 having fine pitch patterning tolerance significantly reduce a die size of the integrated circuit 148 resulting in reduction of a package footprint.

Referring now to FIG. 2, therein is shown a bottom view of the integrated circuit packaging system 100. The integrated circuit packaging system 100 can include multiple rows or a peripheral array of a number of the conductive layer 120. The conductive layer 120 can be formed adjacent or inside a dielectric perimeter 202 of the dielectric 122. The conductive layer 120 can be surrounded by the dielectric 122.

For illustrative purposes, the conductive layer 120 is shown in a shape of a square, although it is understood that the conductive layer 120 can be formed in any shape. For example, the conductive layer 120 can be formed in a shape of a circle.

Figure 3:
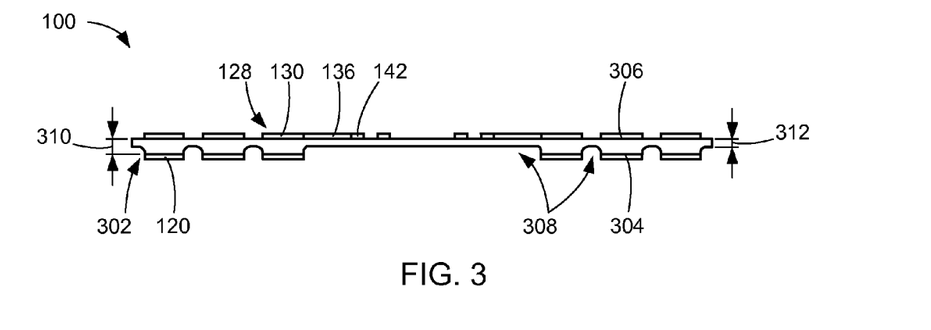
FIG. 3 is a cross-sectional view of the integrated circuit packaging system taken along line 3-3 of FIG. 4 in a plating phase of manufacture.
Figure 4:
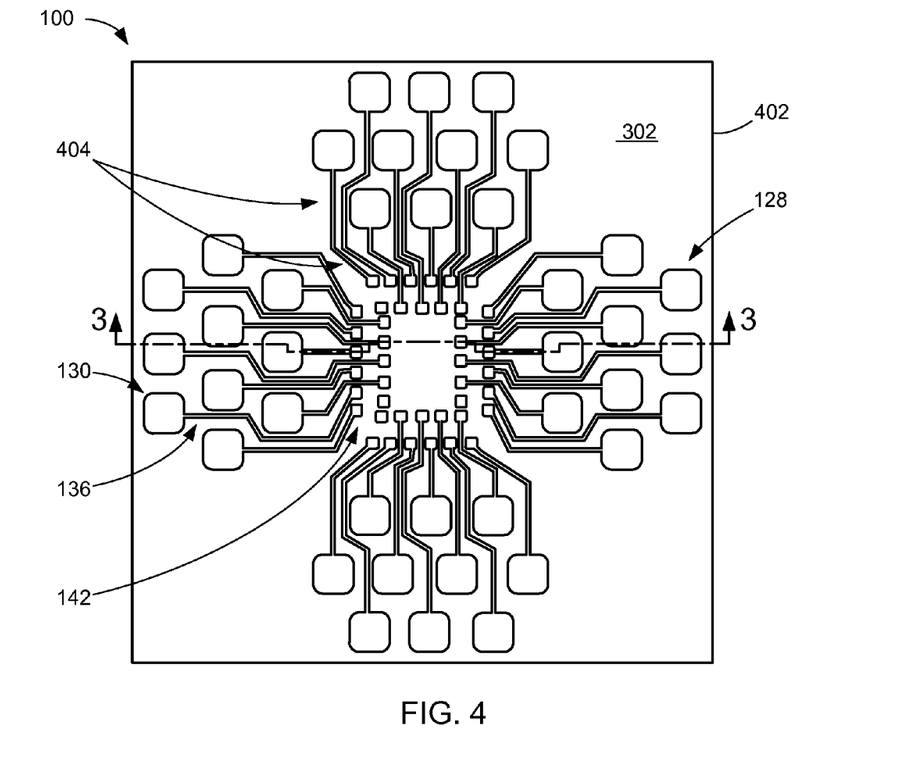
FIG. 4 is a top view of the integrated circuit packaging system in the plating phase.

Referring now to FIG. 3, therein is shown a cross-sectional view of the integrated circuit packaging system 100 taken along line 3-3 of FIG. 4 in a plating phase of manufacture. The cross-sectional view depicts the plating phase of a leadframe manufacture phase.

The integrated circuit packaging system 100 can include a leadframe 302, which is a structure for mounting and connecting a semiconductor device thereto. For example, the leadframe 302 can include a leadframe process dimension tolerance or accuracy of approximately 0.015 millimeter (mm).

The leadframe 302 can be formed with an electrically conductive material including copper (Cu) or any other metallic material. For example, the leadframe 302 can include a structure of a bare copper base, a multi-row copper leadframe, or a routed pre plated frame (PPF) copper (Cu) leadframe.

The leadframe 302 can include a leadframe bottom side 304 and a leadframe top side 306 opposite the leadframe bottom side 304. A portion of the leadframe 302 at the leadframe bottom side 304 can be removed in a controlled manner to form a partially removed region 308. The partially removed region 308 can be formed with a removal process including etching.

For example, the partially removed region 308 can be formed with the leadframe 302 half-etched. Also for example, the cross-sectional view depicts the leadframe 302 as an etched copper frame with a bottom half-etch.

The leadframe 302 can include a leadframe thickness 310. The leadframe 302 can include the partially removed region 308 having a non-removed thickness 312. For example, the leadframe thickness 310 and the non-removed thickness 312 can be approximately 4 millimeters (mm) and 3 millimeters (mm), respectively.

As an example, approximately 1 millimeter (mm) of the leadframe 302 can be removed to form the partially removed region 308 having the non-removed thickness 312 of approximately 3 millimeters (mm). As another example, the non-removed thickness 312 can be at least half of the leadframe thickness 310.

The integrated circuit packaging system 100 can include the conductive layer 120 formed directly on the leadframe bottom side 304. The conductive layer 120 can be formed with an electrically conductive material including a metallic material or a metal alloy.

The conductive layer 120 can be formed with a number of layers. For example, the conductive layer 120 can be formed with a conductive material including nickel (Ni), palladium (Pd), gold (Au), any other metallic material, a metal alloy, or a combination thereof. Also for example, the conductive layer 120 can be formed with nickel-palladium (NiPd) or nickel-palladium-gold (NiPdAu).

As an example, the conductive layer 120 can be formed with a plating process. As another example, the conductive layer 120 can include a structure of a build-up pre plated frame (PPF) that is selectively pre-plated.

The integrated circuit packaging system 100 can include the connection layer 128 directly on the leadframe top side 306. The connection layer 128 can be formed with an electrically conductive material including a metallic material or a metal alloy.

For example, the connection layer 128 can be formed with a number of layers. Also for example, the connection layer 128 can be formed with a conductive material including nickel (Ni), palladium (Pd), gold (Au), any other metallic material, a metal alloy, or a combination thereof. Also for example, the connection layer 128 can be formed with nickel-palladium (NiPd) or nickel-palladium-gold (NiPdAu).

As an example, the connection layer 128 can be formed with a plating process. As another example, the connection layer 128 can include a structure of a build-up pre plated frame (PPF) that is selectively pre-plated.

The connection layer 128 can include the outer pad 130, the conductive trace 136, and the inner pad 142 formed as a single integral structure with a common electrically conductive material. The conductive trace 136 can be electrically connected or attached to the outer pad 130 and the inner pad 142.

Referring now to FIG. 4, therein is shown a top view of the integrated circuit packaging system 100 in the plating phase. The top view depicts a number of the connection layer 128 having the outer pad 130, the conductive trace 136, and the inner pad 142.

The integrated circuit packaging system 100 can include a number of the outer pad 130 connected to a number of the inner pad 142 with a number of the conductive trace 136. The inner pad 142 can be formed at a central portion of the leadframe 302. The inner pad 142 can be formed closer to the central portion of the leadframe 302 than the outer pad 130.

The integrated circuit packaging system 100 can include multiple rows of the outer pad 130 and multiple rows of the inner pad 142. The integrated circuit packaging system 100 can include a peripheral array of a number of the outer pad 130. The outer pad 130 can be formed adjacent or inside a leadframe perimeter 402 of the leadframe 302.

The conductive trace 136 can be formed with a number of segments 404, which are sections of the conductive trace 136 that are contiguously formed as a single integral structure. The segments 404 can be connected or attached to each other between the outer pad 130 and the inner pad 142.

The segments 404 can be formed at a predetermined angle between one another. The predetermined angle helps separate a distance between an array of the outer pad 130 for improved connection to a stack device or an external system level (not shown). For example, the predetermined angle can depend on design guidelines or geometry constraints.

Figure 5:
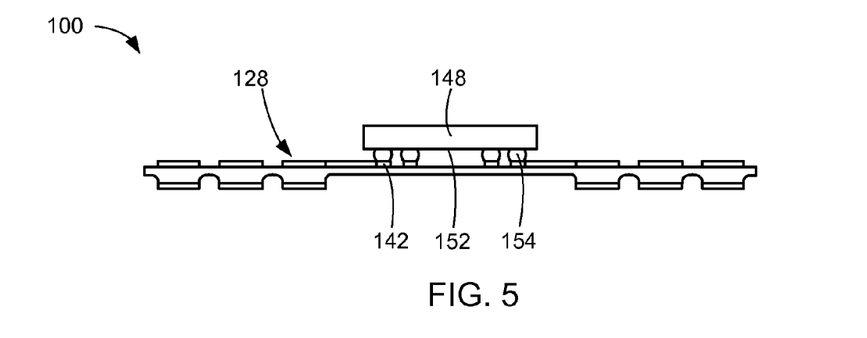
FIG. 5 is the structure of FIG. 3 in an attaching phase.

Referring now to FIG. 5, therein is shown the structure of FIG. 3 in an attaching phase. The integrated circuit packaging system 100 can include the integrated circuit 148 mounted over the connection layer 128. The integrated circuit 148 can include the active side 152 facing the connection layer 128.

The integrated circuit packaging system 100 can include the internal connector 154 connected or attached to the inner pad 142 and the active side 152. The internal connector 154 can be directly on the inner pad 142.

For illustrative purposes, the internal connector 154 is shown as a conductive bump, although it is understood that the internal connector 154 can include any other electrically conductive connectors. For example, the internal connector 154 can include a conductive paste. Also for example, the internal connector 154 can be formed with a conductive material including solder, a metal, or a metallic alloy.

Figure 6:
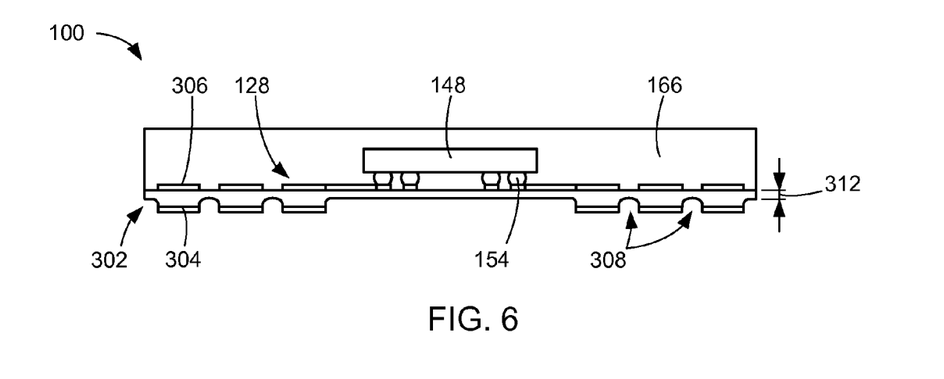
FIG. 6 is the structure of FIG. 5 in the molding phase.

Referring now to FIG. 6, therein is shown the structure of FIG. 5 in the molding phase. The integrated circuit packaging system 100 can include a molding process including liquid epoxy mold or compression molding. The molding process can also include tape assisted molding with adhesive tapes applied over the integrated circuit 148 and applied on the leadframe bottom side 304 to support and cover the partially removed region 308 and a portion of the leadframe 302 protruded, penetrated, or sunk into one of the adhesive tapes.

The molding compound 166 can be molded over the leadframe 302, the connection layer 128, the integrated circuit 148, and the internal connector 154. The molding compound 166 can be formed covering the leadframe top side 306, the connection layer 128, the integrated circuit 148, and the internal connector 154.

It has been discovered that structural integrity of the leadframe 302 is preserved by molding the molding compound 166 with a lower packing pressure unlike transfer molding with a very high packing pressure thereby preventing the partially removed region 308 from being bent down during molding.

It is also been discovered that the partially removed region 308 having the non-removed thickness 312 formed in a controlled manner improves structural integrity of the leadframe 302 thereby eliminating bent at the partially removed region 308 during molding.

Figure 7:
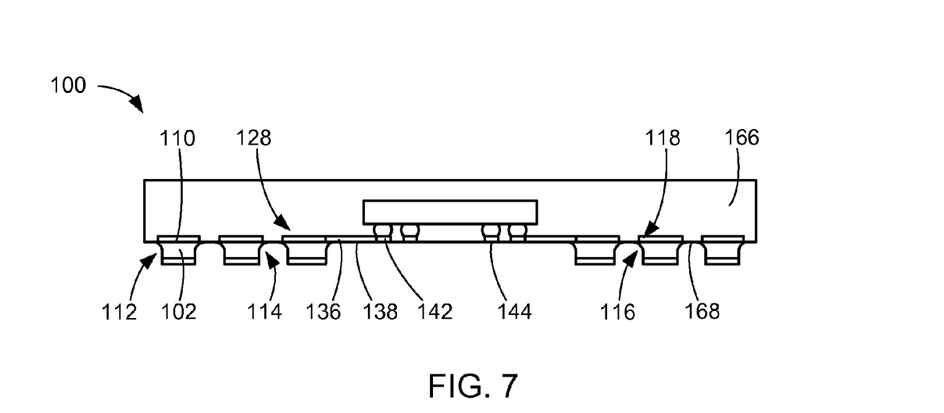
FIG. 7 is the structure of FIG. 6 in a removal phase.

Referring now to FIG. 7, therein is shown the structure of FIG. 6 in a removal phase. The integrated circuit packaging system 100 can include a removal process including etching in the removal phase. The removal process does not affect or remove the connection layer 128. For example, the removal process can include copper etch with a chemical solution including alkali.

A portion of the leadframe 302 of FIG. 3 at the leadframe bottom side 304 of FIG. 3 can be removed forming the lead 102 and exposing portions of the molding bottom surface 168, the trace bottom surface 138, and the inner pad bottom surface 144. The portion of the leadframe 302 to be removed at the leadframe bottom side 304 can include the partially removed region 308 of FIG. 3. The lead 102 can be electrically isolated from another of the lead 102.

The lead 102 can be formed having the horizontal ridge 114 horizontally protruding from the lead non-horizontal side 112. The horizontal ridge 114 can be formed at the lead top side 110.

The horizontal ridge 114 can include the ridge lower side 116 and the ridge upper side 118 above the ridge lower side 116. The lead top side 110 can include the ridge upper side 118. The trace bottom surface 138 can be directly on a portion of the lead top side 110 or a portion of the ridge upper side 118.

The conductive trace 136 and the inner pad 142 can be protected or embedded by the molding compound 166. The conductive trace 136 and the inner pad 142 can be unaffected or not removed during the removal process. It is understood that the removal process does not attack or remove the conductive trace 136 and the inner pad 142.

It has been discovered that the leadframe 302 having the partially removed region 308 provides an advantage with more efficient bottom or back etching due to the leadframe 302 having a bottom half-etch feature thereby effectively controlling the removal process.

Figure 8:
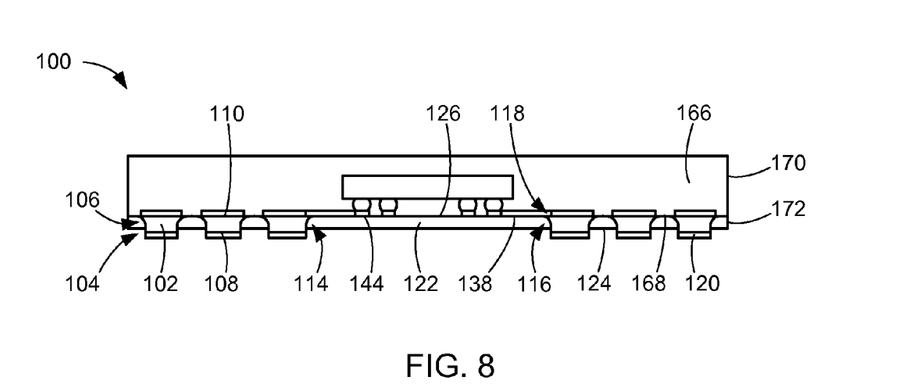
FIG. 8 is the structure of FIG. 7 in an application phase.

Referring now to FIG. 8, therein is shown the structure of FIG. 7 in an application phase. The integrated circuit packaging system 100 can include an application method including screen print, spin-coat, dispense, or capillary action.

The integrated circuit packaging system 100 can include the dielectric 122 applied or filled directly on the trace bottom surface 138, the inner pad bottom surface 144, and the molding bottom surface 168. The dielectric 122 can protect or insulate the trace bottom surface 138 or the inner pad bottom surface 144.

The dielectric 122 can electrically isolate the lead 102 and another of the lead 102. The dielectric 122 can be formed surrounding the horizontal ridge 114. The dielectric 122 can be formed directly on the ridge lower side 116. The dielectric 122 can be formed surrounding the lead top portion 106.

The lead top portion 106 can include the lead top side 110. A plane of the lead top side 110 or a plane of the ridge upper side 118 can be coplanar with a plane of the dielectric top side 126.

The dielectric 122 can include the dielectric bottom side 124 and the dielectric top side 126 opposite the dielectric bottom side 124. The dielectric bottom side 124 can be above the conductive layer 120.

The lead bottom portion 104 can be exposed from the dielectric 122. The lead bottom portion 104 can protrude from the dielectric bottom side 124. The lead bottom portion 104 can include the lead bottom side 108 below the dielectric bottom side 124. The conductive layer 120 can be below the dielectric bottom side 124.

The integrated circuit packaging system 100 can include a package singulation process to produce individual units or packages of the integrated circuit packaging system 100. The package singulation process can include a mechanical or optical process.

The molding compound 166 can include the molding non-horizontal side 170. A plane of the molding non-horizontal side 170 can be coplanar with a plane of the dielectric non-horizontal side 172 of the dielectric 122.

Figure 9:
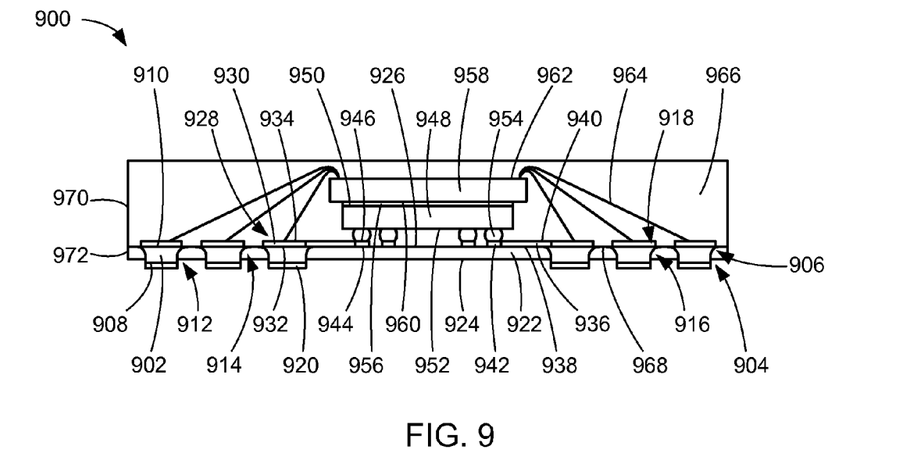
FIG. 9 is a cross-sectional view of an integrated circuit packaging system in a second embodiment of the present invention.

Referring now to FIG. 9, therein is shown a cross-sectional view of an integrated circuit packaging system 900 in a second embodiment of the present invention. The integrated circuit packaging system 900 can be formed in a manner similar to the integrated circuit packaging system 100 of FIG. 1, except for additions of an attachment, a device, and a connector, and the formation of the molding compound 166 of FIG. 1.

The integrated circuit packaging system 900 can include a lead 902 having a lead bottom portion 904, a lead top portion 906, a lead bottom side 908, a lead top side 910, a lead non-horizontal side 912, and a horizontal ridge 914 having a ridge lower side 916 and a ridge upper side 918. The lead 902 can be formed in a manner similar to the lead 102 of FIG. 1.

The integrated circuit packaging system 900 can include a conductive layer 920 and a dielectric 922 having a dielectric bottom side 924 and a dielectric top side 926. The conductive layer 920 and the dielectric 922 can be formed in a manner similar to the conductive layer 120 of FIG. 1 and the dielectric 122 of FIG. 1, respectively.

The integrated circuit packaging system 900 can include a connection layer 928. The connection layer 928 can include an outer pad 930 having an outer pad bottom surface 932 and an outer pad top surface 934. The connection layer 928 can include a conductive trace 936 having a trace bottom surface 938 and a trace top surface 940. The connection layer 928 can include an inner pad 942 having an inner pad bottom surface 944 and an inner pad top surface 946. The connection layer 928 can be formed in a manner similar to the connection layer 128 of FIG. 1.

The integrated circuit packaging system 900 can include a base integrated circuit 948 having a base inactive side 950 and a base active side 952. The integrated circuit packaging system 900 can include a base internal connector 954. The base integrated circuit 948 and the base internal connector 954 can be formed in a manner similar to the integrated circuit 148 of FIG. 1 and the internal connector 154 of FIG. 1, respectively.

The integrated circuit packaging system 900 can include an attach layer 956, which attaches a stack integrated circuit 958 to the base integrated circuit 948. The stack integrated circuit 958 is a semiconductor device.

The stack integrated circuit 958 can include a stack inactive side 960 and a stack active side 962 opposite the stack inactive side 960. The stack integrated circuit 958 can be mounted over the base integrated circuit 948. For example, the stack integrated circuit 958 can include a semiconductor device including a wirebond die or an integrated circuit die.

The stack integrated circuit 958 can include the stack inactive side 960 facing the base inactive side 950. The stack integrated circuit 958 can include the stack inactive side 960 attached to the base inactive side 950 with the attach layer 956.

For illustrative purposes, the stack integrated circuit 958 is shown having a width greater than a width of the base integrated circuit 948, although it is understood that widths of the stack integrated circuit 958 and the base integrated circuit 948 can be of any length. For example, a width of the stack integrated circuit 958 can be approximately equal to a width of the base integrated circuit 948. Widths of the stack integrated circuit 958 and the base integrated circuit 948 are horizontal distances between horizontal extents of the stack integrated circuit 958 and the base integrated circuit 948, respectively.

The integrated circuit packaging system 900 can include a stack internal connector 964, which is an electrically conductive connector. A number of the stack internal connector 964 can be connected or attached to the stack active side 962 and a number of the outer pad top surface 934. The stack internal connector 964 can be directly on the outer pad top surface 934.

The integrated circuit packaging system 900 can include a molding compound 966, which covers a semiconductor package to seal a semiconductor device providing mechanical and environmental protection. The molding compound 966 can be formed covering the dielectric 922, the connection layer 928, the base integrated circuit 948, the base internal connector 954, the attach layer 956, the stack integrated circuit 958, and the stack internal connector 964. The molding compound 966 can be applied over the dielectric top side 926, the outer pad 930, the conductive trace 936, the inner pad 942, the base integrated circuit 948, the base internal connector 954, the attach layer 956, the stack integrated circuit 958, and the stack internal connector 964.

The molding compound 966 can include a molding bottom surface 968. A plane of the molding bottom surface 968 can be coplanar with planes of the outer pad bottom surface 932, the trace bottom surface 938, and the inner pad bottom surface 944. The molding bottom surface 968 and the inner pad bottom surface 944 can be directly on the dielectric top side 926.

The molding compound 966 can include a molding non-horizontal side 970, which is a horizontal extent of the molding compound 966. A plane of the molding non-horizontal side 970 can be coplanar with a plane of a dielectric non-horizontal side 972 of the dielectric 922. The dielectric non-horizontal side 972 is a horizontal extent of the dielectric 922.

It has been unexpectedly found that the stack integrated circuit 958 mounted over the base integrated circuit 948 improves device integration.

It has been unexpectedly determined that the stack internal connector 964 attached to the outer pad top surface 934 allows the stack integrated circuit 958 to be electrically connected to the base integrated circuit 948 and an external system.

Figure 10:
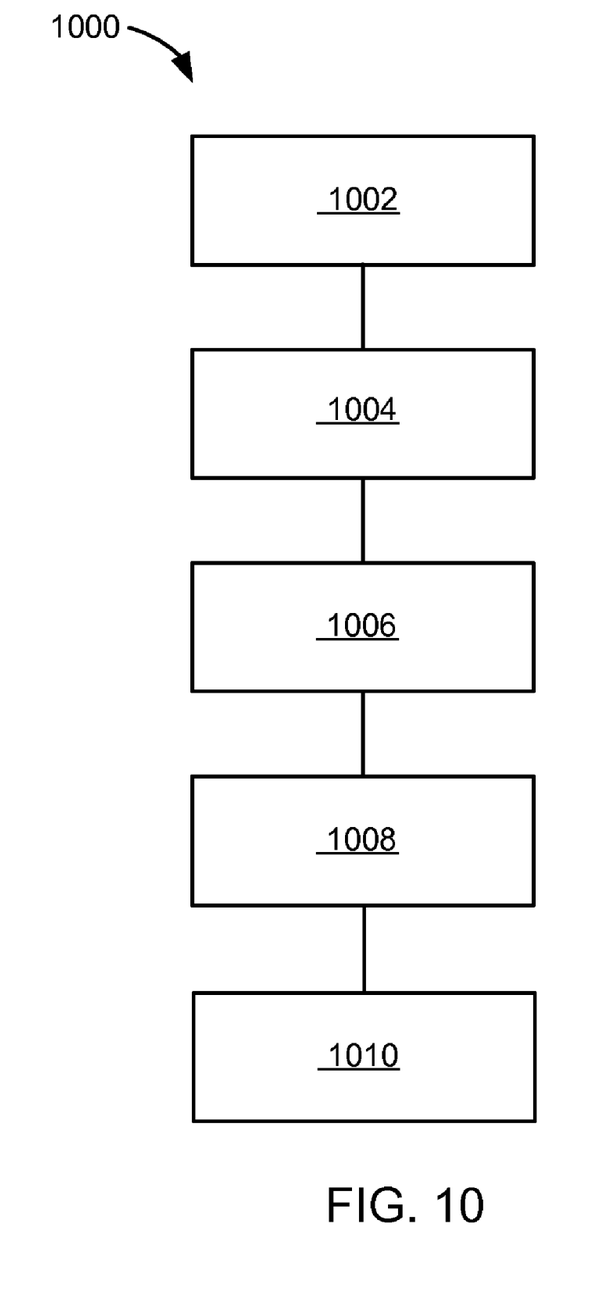
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: forming a lead having a horizontal ridge at a lead top side in a block 1002; forming a connection layer having an inner pad and an outer pad directly on the lead top side, the inner pad having an inner pad bottom surface in a block 1004; mounting an integrated circuit over the inner pad in a block 1006; applying a molding compound, having a molding bottom surface, over the integrated circuit, the inner pad, and the outer pad in a block 1008; and applying a dielectric directly on the molding bottom surface and the inner pad bottom surface in a block 1010.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
    forming a lead having a horizontal ridge at a lead top side;
    forming a conductive layer directly on a lead bottom side of the lead;
    forming a connection layer having a conductive trace, an inner pad, and an outer pad directly on the lead top side, the inner pad having an inner pad bottom surface, the conductive trace attached to and integral with the inner pad and the outer pad;
    mounting an integrated circuit over the inner pad; then
    applying a molding compound, having a molding bottom surface, over the integrated circuit, the inner pad, and the outer pad; and then
    applying a dielectric directly on the molding bottom surface and the inner pad bottom surface, the dielectric having a dielectric bottom side above the conductive layer.

2. The method as claimed in claim 1 wherein forming the connection layer includes forming the connection layer having a conductive trace directly on the horizontal ridge.

3. The method as claimed in claim 1 further comprising mounting a stack integrated circuit over the integrated circuit.

4. A method of manufacture of an integrated circuit packaging system comprising:
    forming a lead having a horizontal ridge at a lead top side;
    forming a conductive layer directly on a lead bottom side of the lead;
    forming a connection layer having a conductive trace, an inner pad, and an outer pad directly on the lead top side, the inner pad having an inner pad bottom surface, the conductive trace attached to and integral with the inner pad and the outer pad;
    mounting an integrated circuit over the inner pad; then
    attaching an internal connector to the integrated circuit and the inner pad; then
    applying a molding compound, having a molding bottom surface, over the integrated circuit, the inner pad, and the outer pad; and then
    applying a dielectric directly on the molding bottom surface and the inner pad bottom surface, the dielectric having a dielectric bottom side above the conductive layer.

5. The method as claimed in claim 4 wherein forming the connection layer includes forming the connection layer having a conductive trace directly on the horizontal ridge and the dielectric.

6. The method as claimed in claim 4 further comprising:
    mounting a stack integrated circuit over the integrated circuit; and
    attaching a stack internal connector to the stack integrated circuit and the outer pad.

7. An integrated circuit packaging system comprising:
    a lead having a horizontal ridge at a lead top side;
    a conductive layer directly on a lead bottom side of the lead;
    a connection layer having a conductive trace, an inner pad, and an outer pad directly on the lead top side, the inner pad having an inner pad bottom surface, the conductive trace attached to and integral with the inner pad and the outer pad;
    an integrated circuit over the inner pad;
    an internal connector attached to the integrated circuit and the inner pad;
    a molding compound, having a molding bottom surface, over the integrated circuit, the inner pad, and the outer pad; and a dielectric directly on the molding bottom surface and the inner pad bottom surface, the dielectric having a dielectric bottom side above the conductive layer.

8. The system as claimed in claim 7 wherein the connection layer includes a conductive trace directly on the horizontal ridge.

9. The system as claimed in claim 7 further comprising a stack integrated circuit over the integrated circuit.

10. The system as claimed in claim 7 wherein the connection layer includes a conductive trace directly on the horizontal ridge and the dielectric.

11. The system as claimed in claim 7 further comprising:
a stack integrated circuit over the integrated circuit; and
a stack internal connector attached to the stack integrated circuit and the outer pad.

* * * * *